United States Patent [19]

Ikegami

[11] Patent Number: 5,245,250
[45] Date of Patent: Sep. 14, 1993

[54] METHOD FOR CONTROLLING A CHARGED PARTICLE BEAM

[76] Inventor: Hidetsugu Ikegami, 12-50, Hibarigaoka 2-Chome, Takarazuka-shi, Hyogo 665, Japan

[21] Appl. No.: 640,435
[22] PCT Filed: Jul. 11, 1990
[86] PCT No.: PCT/JP90/00892
    § 371 Date: Feb. 6, 1991
    § 102(e) Date: Feb. 6, 1991
[87] PCT Pub. No.: WO91/01038
    PCT Pub. Date: Jan. 24, 1991

[30] Foreign Application Priority Data

Jul. 11, 1989 [JP] Japan .................... 1-177085

[51] Int. Cl.[5] ............................ H01J 23/06
[52] U.S. Cl. .................... 315/5.29; 315/5.35
[58] Field of Search ............ 315/4, 5, 5.24, 5.26, 315/5.29, 5.35; 330/4, 94.45, 97.48; 331/79, 94.1

[56] References Cited

U.S. PATENT DOCUMENTS

| | | | |
|---|---|---|---|
| 3,118,083 | 1/1964 | Ash | 315/5 X |
| 3,353,053 | 11/1967 | Bott | 315/4 X |
| 3,398,376 | 8/1968 | Hirshfield | 315/5 X |
| 4,199,709 | 4/1980 | Alirot et al. | 315/4 |
| 4,370,621 | 1/1983 | Sprangle et al. | 315/5 X |
| 4,422,045 | 12/1983 | Barnett | 315/4 X |
| 4,562,380 | 12/1985 | Dionne | 315/4 |
| 4,571,524 | 2/1986 | Mourier | 315/5 X |
| 4,988,956 | 1/1991 | Ono et al. | 315/5.35 X |

FOREIGN PATENT DOCUMENTS 124395  11/1984  European Pat. Off. ........ 315/4

OTHER PUBLICATIONS

European Search Report EP 90 91 0931; Search completed Jul. 10, 1991.

Primary Examiner—Robert J. Pascal
Assistant Examiner—Benny T. Lee
Attorney, Agent, or Firm—Burns, Doane, Swecker & Mathis

[57] ABSTRACT

In an electron beam apparatus making use of an electron beam, a solenoid magnetic field generating section is disposed along an electron beam, and a cyclotron maser stimulating high-frequency resonator is provided within this magnetic field generating section. An emittance of the electron beam is adjusted by projecting a cyclotron maser stimulating high frequency wave in the same direction as or in the opposite direction to the traveling direction of the electron beam, and thereby a high-luminosity beam is generated.

9 Claims, 1 Drawing Sheet

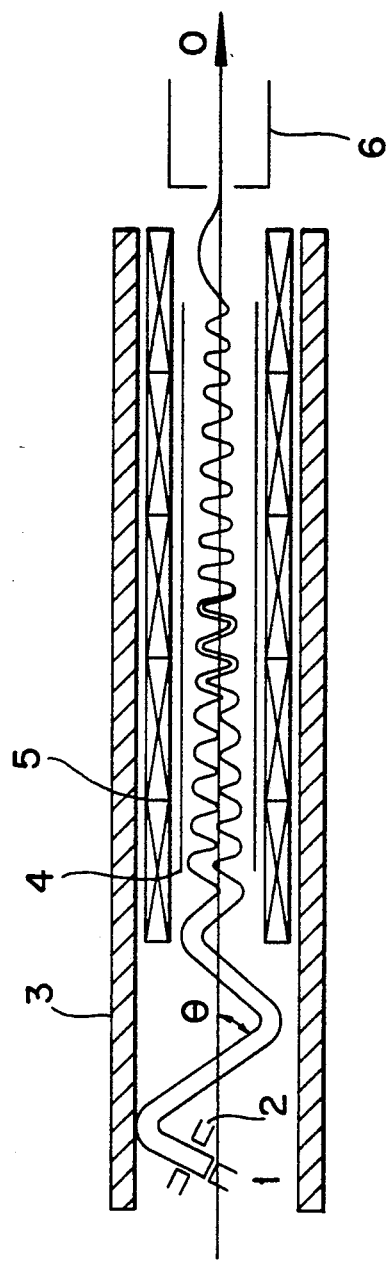

METHOD FOR CONTROLLING A CHARGED PARTICLE BEAM

BACKGROUND OF THE INVENTION

1. Technical Field

The present invention relates to a method of controlling a charged particle beam, such as an electron beam or an ion beam in an emittance for use in, for example, an electron beam apparatus such as an electron accelerator or an electron microscope for controlling the charged particle beam.

2. State of the Art

Generally, in an electron beam apparatus such as an electron microscope, energy of transverse thermal motion would occur within a transverse plane which is perpendicular to the direction of a beam generated by an electron gun. The transverse thermal motion can be replaced by the term "emittance" which is used in the particle optics art and which is defined as a product of an inclination angle with respect to the axial direction of the electron beam and spatial spread of the electron beam along the direction of the inclination projected on the transverse plane. Such a magnitude of the emittance determines the upper limit of a resolution of an electron microscope.

As will be obvious even from the above-mentioned fact, in order to get an electron beam of high quality, it is required to minimize an emittance of the electron beam as well as to make energy uniform by cooling the electron beam. However, a method of improving an emittance in an electron beam apparatus has not been proposed at all so far.

It is an object of the present invention to resolve this problem and to momentarily cool an electron beam regardless of a pulsed beam or a continuous beam.

SUMMARY OF THE INVENTION

The invention is applicable to use in an electron beam apparatus, such as an electron accelerator or an electron microscope. According to an aspect of this invention, the apparatus comprises magnetic field generating means formed by a solenoid having a solenoid axis for generating a magnetic field along a predetermined axial direction, beam generating means for generating a charged particle beam, such as an electron beam, and introducing said charged particle beam along a traveling direction which is extended along said predetermined axial direction, and radio frequency wave injecting means located within the magnetic field generating means for injecting a radio frequency wave in a direction parallel to the predetermined axial direction so that a cyclotron maser beam, referred to herein as a maser, is generated in the charged particle beam to reduce charged particle beam emittance. With this structure, kinetic energy of the charged particle beam is forcibly radiated in the form of the electron cyclotron maser on a plane transverse to the traveling direction of the charged particle beam. In addition, the radio frequency may be injected, or projected, in a direction opposite to or identical with the traveling direction of the charged particle beam, referred to in the following exemplary embodiments as an electron beam.

Furthermore, an apparatus according to another aspect of this invention assures stimulation of the charged particle beam, after a part of the energy has been converted into cyclotron gyration by obliquely accelerating electrons with respect to the axial direction of the electron beam or by making use of deflection magnets, with improved emittance being achieved by means of cyclotron maser.

More particularly, a solenoid magnetic field generating section is disposed within the electron beam apparatus, and in this section, a solenoid magnetic field $B_o$ (tesla) is generated in the axial direction of the electron beam. Thereby, electrons make a cyclotron gyration at an angular frequency of $\omega_c^*/\gamma_\perp = eB_o/m_o\gamma_{195}$ within the transverse plane, where $\omega_c^*$ is given by $eB_o/m_o$ and is representative of a cyclotron gyration angular frequency. Here, $e$ and $m_o$ denote charge and rest mass, respectively, of an electron. In the following, it is assumed that all the physical quantities are given in practical units. Here, $\gamma_\perp$ denotes the relativistic energy factor of the transverse motion, where c represents the light velocity. At this time, the kinetic energy $(\gamma_\perp - 1)m_o c^2$ within the transverse plane is radiated in a manner similar to that based on the principle of the electron cyclotron maser, and thereby improvement in an emittance is achieved.

Now, an electron beam is incident at an angle $\theta$ with respect to the axial direction of the magnetic field, and by making use of the generation principle of the electron cyclotron maser cooling according to the present invention which is an expansion of the generation principle of the electron cyclotron maser, non-uniform energy in the transverse plane of the electron beam is forcibly radiated resulting in improvement of an emittance and equalization of total energy.

While a stimulating high frequency wave is generated by a high-frequency resonator mounted in a solenoid magnetic field and the electron cyclotron radiation is stimulated as a result of generation of the high frequency wave a standing wave may be preferable from a practical viewpoint. The angular frequency $\omega$ of the stimulating high frequency wave and its frequency bandwidth $\Delta\omega$ should fulfill the following condition for cyclotron maser cooling (abbreviated as CMC):

$$\omega = \frac{\omega_c^*}{|1 - (\beta_\|/\beta_p)|\gamma_{\perp,min}\gamma_{\|,min}}$$

$$\frac{\Delta\omega}{\omega} \approx 2.5 \frac{\Delta\gamma_\perp}{\gamma_\perp}$$

where $\beta_\|$ is representative of a velocity factor of a parallel component of the electron beam along the axial direction of the magnetic field and is defined by $\beta_\| \equiv v_\|/c$, and $\beta_p$ is representative of a propagation velocity factor of the stimulating high frequency wave in the solenoid magnetic field generating section and where, in turn, $v_\|$ is representative of an electron velocity in an axial direction of the magnetic field, as well known in relativity theory. Therefore, $c\beta_p$ denotes a propagation group velocity of the high frequency wave within the resonator. When resonance is obtained by a traveling wave component in the direction of the electron beam of the high frequency wave, $\beta_p > 0$, but with respect to a backward traveling wave component, $\beta_p < 0$, and $\gamma_{81}$ denotes a relativistic energy factor of the motion in the axial direction of electron beam, which is represented by:

$$\gamma_\|^2 = 1 + \beta_\|^2\gamma^2, \gamma = 1 + \beta^2\gamma^2$$

In addition, $\beta_\| = v_\|/c$ is fulfilled, where $v_\|$ denotes an electron velocity in the axial direction of the magnetic field. $\gamma_{\perp,min}$ and $\gamma_{\|,min}$ respectively mean minimum values of $\gamma_\perp$, $\gamma_\|$. $\Delta\gamma_\perp$ represents a deviation width of $\gamma_{195}$ produced by non-uniformity of the electron energy within the transverse plane.

Under these two conditions, the cooling time $\tau_\perp$ of CMC is as follows:

$$\tau_\perp \simeq \frac{ceB_o}{2r_e I(\omega)} \cdot \left(\frac{\Delta\omega}{\omega}\right)^3 \times \frac{1}{|(1-(\beta_\|/\beta_p)|(\gamma_\perp - 1)}$$

Here, $r_e$ denotes the classical electron radius, and $I(\omega)$ denotes a magnitude of a Poyntin vector of the stimulating high frequency wave, that is, an energy flow density.

Now, by way of example, assuming that $\gamma_\perp = 1.02$ is fulfilled, namely electrons derived from an electron gun in which transverse energy of the beam is 10 keV (kiloelectron-volts), are led into a magnetic field of $B_o = 0.1$ tesla, then a stimulating high-frequency wave having a frequency $\omega/2\pi = 2.8$ GHz (giga-hertz) corresponding to a traveling wave in the direction of the beam is generated as a standing wave in the CMC section of 0.22 m in length, and its power density is $I(\omega) \simeq 150 W.m^{-2}$, then the cooling time $\tau_\perp$ becomes 0.2 times as large as the CMC section traveling time of electrons of $2 \times 10^{-8}$ (seconds), the emittance is reduced by a factor of $\exp(-2/0.2) = (22000)^{-1}$, and all the electrons would make a gyration in the same phase as the stimulating high frequency wave.

BRIEF DESCRIPTION OF THE DRAWINGS

The drawing is a general layout view in the case where the method according to the present invention has been applied to an electron microscope as one example for embodying the method.

0 . . . electron beam, 1 . . . electron gun, 2 . . . accelerating electrodes, 3 . . . magnetic shield, 4 . . . CMC stimulating high-frequency resonator, 5 . . . solenoid magnet, 6 . . . acceleration system in an electron microscope main body.

BEST MODE FOR EMBODYING THE INVENTION

In the following, description will be made on one preferred embodiment of the electron beam cooling method according to the present invention with reference to the drawings.

The drawing presents a general layout view of an electron microscope at the time when the method according to the present invention has been embodied in that apparatus, and the apparatus is composed of the respective elements of: an electron gun 1, accelerating electrodes 2, a magnetic shield 3, an electron cyclotron maser cooling (CMC) stimulating high-frequency resonator 4, a solenoid magnet 5, and an electron microscope main body acceleration system 6.

Thus, an electron beam emitted from the accelerating electrodes 2 is subjected to radiation cooling in the CMC stimulating high-frequency resonator 4 located within the solenoid magnet 5. As a result, an emittance of the electron beam is improved to make the beam have high quality. More particularly, in the CMC stimulating high-frequency resonator 4, a magnetic field $B_O$ is generated in the axial direction of the electron beam by means of the solenoid magnet 5, which causes electron to do cyclotron gyration within the transverse plane. And, by injecting or projecting a high-frequency wave to this electron beam either in the opposite direction or in the same direction within the maser beam stimulating high-frequency resonator 4 in the CMC section, electron cyclotron maser cooling is caused, and an emittance of the electron beam is greatly improved.

INDUSTRIAL AVAILABILITY

While a beam cooling method according to the present invention has been described above with respect to the case where it was applied to an electron microscope, it can be similarly applied to electron apparatus other than such an electron microscope. In addition, use may be made of a stimulating high frequency wave having a frequency corresponding to a value which is equal to an integer multiple of $\omega^*$ instead of the fundamental frequency $\omega^*$ mentioned above.

As described above, according to the present invention, it is possible to highly qualify an emittance of an electron beam and to obtain an electron beam having extremely excellent luminosity, by disposing a solenoid magnetic field generating section in the axial direction of an electron beam and by injecting a cyclotron maser stimulating high-frequency wave to the electron beam either in the opposite direction or in the same direction within the above-mentioned solenoid magnetic field generating section.

I claim:

1. An apparatus for controlling emittance of a charged particle beam traveling in a traveling direction to obtain a cooled charged particle beam having particles of uniform direction and velocity comprising:

magnetic field generating means for generating a magnetic field in a predetermined direction along said traveling direction;

beam generating means for generating and introducing a charged particle beam to said magnetic field in said traveling direction; and radio frequency wave injecting means located within the magnetic field for injecting a radio frequency wave in a direction parallel to said predetermined direction for interaction with said charged particle beam, said radio frequency wave having a predetermined angular frequency so that a cyclotron maser beam is generated within said magnetic field to reduce the emittance of the charged particle beam and thereby cool the charged particle beam.

2. Apparatus according to claim 1, wherein said magnetic field generating means further includes:

a solenoid magnet for generating the magnetic field in the predetermined direction of the charged particle beam.

3. Apparatus according to claim 2, wherein said radio frequency wave injecting means further includes:

a cyclotron maser cooling stimulating high-frequency resonator located within said magnetic field.

4. Apparatus according to claim 3, wherein said cyclotron maser cooling stimulating high-frequency resonator further includes:

means for generating a stimulating high frequency wave having a frequency bandwidth determined as a function of a relativistic energy factor of motion of the stimulating high frequency wave in the traveling direction of the charged particle beam.

5. Apparatus according to claim 3, wherein said cyclotron maser cooling stimulating high-frequency resonator further includes:

means for generating a stimulating high-frequency wave having a ratio of frequency bandwidth to angular frequency which corresponds to 2.5 times a ratio of a relativistic energy factor bandwidth to a relativistic energy factor.

6. A method of controlling an emittance of a charged particle beam traveling in a traveling direction to obtain a cooled charged particle beam having particles of uniform direction and velocity, said method comprising the steps of:

generating a magnetic field in a predetermined direction along said traveling direction;

introducing the charged particle beam into said magnetic field in said traveling direction; and injecting a cyclotron maser stimulating frequency wave towards said charged particle beam along said predetermined direction, said cyclotron maser stimulating frequency wave having a predetermined angular frequency and interacting with said charged particle beam such that thermal motion energy of said charged particle beam is radiated within a plane transverse to said traveling direction for reducing emittance of the charged particle beam to cool said charged particle beam.

7. A method according to claim 6, wherein said charged particle beam is introduced into said magnetic field such that said charged particle beam is inclined at an angle relative to said predetermined direction, said step of introducing further including a step of:

accelerating the charged particle beam into said magnetic field to interact with said cyclotron maser stimulating frequency wave within said magnetic field.

8. A method according to claim 6, wherein said cyclotron maser stimulating frequency wave is directed in a forward direction of said traveling direction of said charged particle beam.

9. A method according to claim 6, wherein said cyclotron maser stimulating frequency wave is injected in a direction opposite to said traveling direction of said charged particle beam.

* * * * *